(12) United States Patent
Onoe

(10) Patent No.: US 8,237,329 B2
(45) Date of Patent: Aug. 7, 2012

(54) ELASTIC WAVE DEVICE AND ELECTRONIC COMPONENT

(75) Inventor: Morio Onoe, Setagaya-ku (JP)

(73) Assignee: Nihon Dempa Kogyo Co., Ltd., Tokyo (JP)

( * ) Notice: Subject to any disclaimer, the term of this patent is extended or adjusted under 35 U.S.C. 154(b) by 445 days.

(21) Appl. No.: 12/655,414

(22) Filed: Dec. 30, 2009

(65) Prior Publication Data

US 2010/0171390 A1    Jul. 8, 2010

(30) Foreign Application Priority Data

Jan. 7, 2009    (JP) .................................. 2009-001789

(51) Int. Cl.
*H01L 41/09*    (2006.01)
*H03H 9/19*    (2006.01)

(52) U.S. Cl. ......... 310/320; 310/321; 310/366; 310/367

(58) Field of Classification Search .................. 310/311, 310/320, 321, 366, 365, 355, 313 D, 313 R, 310/367, 364, 348; 73/579, 645; 333/133; H01L 41/09; H03H 9/19

See application file for complete search history.

(56) References Cited

U.S. PATENT DOCUMENTS

| | | | | |
|---|---|---|---|---|
| 6,232,699 | B1 * | 5/2001 | Wajima ........................ | 310/320 |
| 6,750,593 | B2 * | 6/2004 | Iwata ............................ | 310/321 |
| 7,868,523 | B2 * | 1/2011 | Tanaka et al. ................. | 310/366 |
| 2010/0171390 | A1 * | 7/2010 | Onoe ........................... | 310/320 |

FOREIGN PATENT DOCUMENTS

| | | |
|---|---|---|
| JP | 43-15538 | 6/1943 |
| JP | 50-19024 | 7/1975 |
| JP | 2000-091878 | 3/2000 |

OTHER PUBLICATIONS

"Improvement of Frequency Drift of AT-cut Resonators Using an Unelectroded Resonant Region", IEEE International Frequency Control Symposium and PDA Exhibition, 2001, p. 624, Fig. 1(b), Fig. 7.
"Straight Crested Wave Analysis of Quartz MEMS Ring Electroded Mesa Resonators", IEEE Ultrasonics Symposium, 2002, p. 999, Fig. 2.
"3-D Modeling of High-Q Quartz Resonators for VHF-UHF Applications", Proceedings of the 2003 IEEE International Frequency Control Symposium and PDA Exhibition Jointly with 17th European Frequency and Time Forum, 2003, p. 824, Fig. 2.

* cited by examiner

*Primary Examiner* — Thomas Dougherty
*Assistant Examiner* — Karen B Addison
(74) *Attorney, Agent, or Firm* — Jordan and Hamburg LLP

(57) ABSTRACT

To provide an elastic wave device that is small sized and in which a frequency fluctuation due to a change with time hardly occurs, and an electronic component using the above elastic wave device. A trapping energy mode portion 2 provided in an elastic wave waveguide 10 made of an elastic body material excites a second elastic wave being an elastic wave in an energy trapping mode by a specific frequency component included in a first elastic wave being an elastic wave in a first or higher-order propagation mode propagated from a first propagation mode portion 4, and a cutoff portion 3 provided in a peripheral region of the trapping energy mode portion 2 has a cutoff frequency being a frequency higher than that of the second elastic wave. A second propagation mode portion mode-converts the second elastic wave leaked through the cutoff portion to a third elastic wave being the elastic wave in the propagation mode to propagate the third elastic wave.

13 Claims, 16 Drawing Sheets

(a) RESIST COATING (b) RESIST PATTERNING (c) DRY ETCHING (d) RESIST COATING (e) RESIST PATTERNING (f) DRY ETCHING

MULTI-MODE COUPLED FILTER

ELASTIC WAVE DEVICE AND ELECTRONIC COMPONENT

BACKGROUND OF THE INVENTION

1. Field of the Invention

The present invention relates to an elastic wave device using a trapping energy effect, and particularly relates to a technique to miniaturize the elastic wave device.

2. Description of the Related Art

When controlling frequency or selecting frequency in a small-sized high frequency communication device such as a portable terminal, there is a small-sized high frequency communication device employing an oscillator or a filter using an energy trapping type resonator (hereinafter, the oscillator and the filter are generically called an elastic wave device).

An energy trapping type elastic wave device obtains a necessary frequency response by using resonance to occur by trapping energy of thickness vibration in a piezoelectric body of quartz-crystal or the like. The thickness vibration to be used in the elastic wave device of this type vibrates at a frequency on a high frequency side in the vicinity of a cutoff frequency of the piezoelectric body. Thus, electrodes for excitation are provided at center portions on an upper surface and a lower surface of, for example, a plate-shaped piezoelectric body, and a resonant frequency of thickness vibration in a region having the electrodes provided thereon is reduced by a mass addition effect of the electrodes to be lower than a cutoff frequency of the thickness vibration in a peripheral portion to thereby achieve trapping of the energy of the thickness vibration in the region having the electrodes provided thereon.

Here, a cutoff frequency of a piezoelectric body is in inverse proportion to a thickness of the piezoelectric body, so that it is necessary to thin the piezoelectric body in order to increase a resonant frequency of vibration to be obtained by energy trapping, (which is called an energy trapping mode), and in combination with miniaturization and sophistication in performance of a portable terminal, the elastic wave device is rapidly miniaturized.

However, when the piezoelectric body is thinned in order to increase the resonant frequency, it is also necessary to thin the electrodes to be suitable for energy trapping. When the electrodes are thinned, there is a fear that an insertion loss of the whole elastic wave device is increased due to an insufficiency of electric conductivity.

Normally, however, there is a high fear that masses of the electrodes constituted by metal and the like change with time due to oxidation, corrosion, or the like, and the elastic wave device to have the electrodes directly provided on the region where energy trapping is performed, (which will be called an energy trapping portion, hereinafter), has a problem that the resonant frequency changes by an influence of a mass change in the electrodes.

Thus, in order to suppress the above influence of the change with time in the electrode masses, various types of elastic wave devices to have no electrode provided on a region where resonance is generated are proposed. In Patent Document 1, for example, there is disclosed a resonator in which electrodes for excitation are provided at both right and left ends of a plate-shaped piezoelectric body, and a center region sandwiched between regions of both the right and left ends is not provided with an electrode to be set as a region to determine a resonant frequency, and groove-shaped cuts are provided between the region of the right end and the center region and between the region of the left end and the center region, thereby separating the respective regions elastically and moderately. Further, in Patent Document 2 and Non Patent Document 1, there is disclosed a piezoelectric vibrator in which electrodes for excitation are provided on regions of both right and left ends of a plate-shaped piezoelectric substrate, and an electrode is not provided on a center region sandwiched between these regions, and by making a thickness of the region having no electrode provided thereon thicker than those of the regions of both the ends, resonant frequencies of these regions are made approximately the same, thereby enabling the respective regions to be coupled to one another acoustically.

Besides the above, in Non Patent Document 2 and Non Patent Document 3, there is disclosed a resonator of a type in which a region without an electrode, which is formed thicker than a periphery and called a mesa, is provided at a center portion of a plate-shaped piezoelectric body, and electrodes for excitation are formed in a groove formed in a periphery of this mesa to obtain resonance by using the electrodes and a trapping energy effect to occur in the mesa surrounded by the electrodes.

These resonators (the piezoelectric vibrator) disclosed in Patent Document 1, Patent Document 2, and Non Patent Document 1 to Non Patent Document 3, by providing the region of a center side without an electrode being provided independently of the regions for excitation provided with the electrodes, manage to have little effect of the change with time to occur in the electrodes on the region of the center side, and thus increase long-term frequency stability as a whole of the resonator or the piezoelectric vibrator (the elastic wave device).

Incidentally, in Patent Document 3, there is disclosed a technique in which thicknesses of regions of both ends with electrodes provided thereon of a vibration wave propagating medium to be a vibrator are thinned, and on the other hand, a thickness of a center region sandwiched between these regions and having no electrode provided thereon is thickened, and further a length of the above center region is adjusted to satisfy a predetermined condition, thereby taking out only a desired harmonic vibration from among a plurality of hormonics excited in the electrode on one side. As described above, in the vibrator disclosed in Patent Document 3, an object of providing the center region without an electrode is different from that of stability of a resonant frequency.

[Patent Document 1]
 Japanese Patent Publication No. Sho 43-15538: page 2 left column lines 12 to 23, FIG. 2a
[Patent Document 2]
 Japanese Patent Application Laid-open No. 2000-91878: claim 1, paragraphs 0024 and 0025, FIG. 4
[Patent Document 3]
 Japanese Patent Publication No. Sho 50-19024: page 173 column 2 lines 16 to 30, FIG. 2(b)
[Non Patent Document 1]
 "IMPROVEMENT OF FREQUENCY DRIFT OF AT-CUT RESONATORS USING AN UNELECTRODED RESONANT REGION", IEEE International Frequency Control Symposium and PDA Exhibition, 2001, p. 624, FIG. 1(b), FIG. 7
[Non Patent Document 2]
 "STRAIGHT CRESTED WAVE ANALYSIS OF QUARTZ MEMS RING ELECTRODED MESA RESONATORS", IEEE ULTRASONICS SYMPOSIUM, 2002, P. 999, FIG. 2
[Non Patent Document 3]
 "3-D MODELING OF HIGH-Q QUARTZ RESONATORS FOR VHF-UHF APPLICATIONS", Proceedings of the 2003 IEEE International Frequency Control Symposium and PDA Exhibition Jointly with 17th European Frequency and Time Forum, 2003, p. 824, FIG. 2

SUMMARY OF THE INVENTION

Each elastic wave device disclosed in above-described Patent Document 1, Patent Document 2, Non Patent Document 1 to Non Patent Document 3 is structured in a manner that an electrode is not provided on a center region to obtain resonance in order to suppress an influence on a resonant frequency based on a change with time in mass of an electrode. However, these elastic wave devices are constituted as what is called a composite resonator (composite vibrator) type elastic wave device to generate resonance by using vibration in the same mode as a vibration mode generated in regions having electrodes provided thereon, so that it is not possible to completely eliminate the influence that a frequency change in the vibration mode due to a mass change in the electrodes has on the resonant frequency to be obtained in the region having no electrode provided thereon.

Particularly, when a piezoelectric body of the elastic wave device is thinned in order to obtain high frequency resonance, a change rate of a mass loading effect increases even though a slight mass change of the piezoelectric body occurs. Thus, the frequency change in the vibration mode to be excited in the regions having the electrodes provided thereon also increases, resulting that the resonant frequency also changes significantly. Accordingly, it is not possible to stabilize the resonant frequency sufficiently in conventional methods disclosed in above-described respective Patent Documents and Non Patent Documents, and the change with time in the electrode mass is still a significant obstacle to a further increase in frequency and miniaturization of the elastic wave device.

The present invention has been made under such circumstances, and an object thereof is to provide an elastic wave device that is small sized and in which a frequency fluctuation due to aging hardly occurs, and an electronic component using the above elastic wave device.

An elastic wave device according to the present invention includes:

a first propagation mode portion provided in an elastic wave waveguide made of an elastic body material;

a trapping energy mode portion provided in the elastic wave waveguide and in which a second elastic wave being an elastic wave in an energy trapping mode is excited by a specific frequency component included in a first elastic wave being an elastic wave in a first or higher-order propagation mode propagated from the first propagation mode portion;

a cutoff portion provided in a peripheral region of the trapping energy mode portion and having a cutoff frequency being a frequency higher than that of the second elastic wave; and a second propagation mode portion provided at a position adjacent to the trapping energy mode portion across the cutoff portion along a direction in which the first elastic wave propagates, and mode-converting the second elastic wave leaked through the cutoff portion to a third elastic wave being the elastic wave in the first or higher-order propagation mode to propagate the third elastic wave.

Here, the cutoff portion may be formed to have a cutoff frequency being a frequency higher than that of the second elastic wave because a thickness of the elastic body material is thinner than that of the trapping energy mode portion. Further, it is preferable that the elastic wave waveguide is formed in a manner that a thickness of the elastic body material in an outside region of the cutoff portion is thicker than that of the cutoff portion. Further, it is suitable that the trapping energy mode portion is formed in a flat plate shape or a plano-convex lens shape, and the trapping energy mode portion may be formed in a manner that a planar shape thereof is a polygon with four or more angles, or a circle, or an ellipse.

Further, the elastic wave device includes two or more trapping energy mode portions whose peripheries are each surrounded by the cutoff portion, and in which the trapping energy mode portions are provided adjacently to each other or one another in a propagation direction of the elastic wave in the propagation mode to enable second elastic waves to be excited in the respective trapping energy mode portions to be coupled to each other or one another, and thereby the elastic wave device may also be constituted as a multi-mode coupled filter.

Then, the elastic body material is a piezoelectric body, and it is also preferable that a first electrode to excite the first elastic wave is provided on the first propagation mode portion and a second electrode to take out the third elastic wave is provided on the second propagation mode portion or alternatively, it is also preferable that the first elastic wave is excited by irradiating the first propagation mode portion with a laser beam and the third elastic wave is detected by a laser type vibration meter. Further, the elastic wave device may also be constituted in a manner that the first propagation mode portion is used as the second propagation mode portion. Furthermore, the second elastic wave may also be an elastic wave in a high-order energy trapping mode, and an adsorption layer to adsorb a substance to be sensed may also be formed on a front surface of the trapping energy mode portion.

Further, an electronic component according to the present invention includes each of the above-described elastic wave devices.

According to the present invention, an elastic wave in a first or higher-order propagation mode is propagated in an elastic wave waveguide as a first elastic wave and a second elastic wave in an energy trapping mode is excited by a specific frequency component included in the first elastic wave in a trapping energy mode portion whose periphery is surrounded by a cutoff portion, and thereby a resonance response can be obtained without providing an electrode on the trapping energy mode portion. Accordingly, a change in a frequency characteristic due to a mass change in an electrode does not occur in the trapping energy mode portion, so that it is possible to obtain an elastic wave device in which further miniaturization thereof is easy to be performed and a frequency fluctuation due to aging hardly occurs.

DETAILED DESCRIPTION OF THE PREFERRED EMBODIMENT(S)

Figure 1:
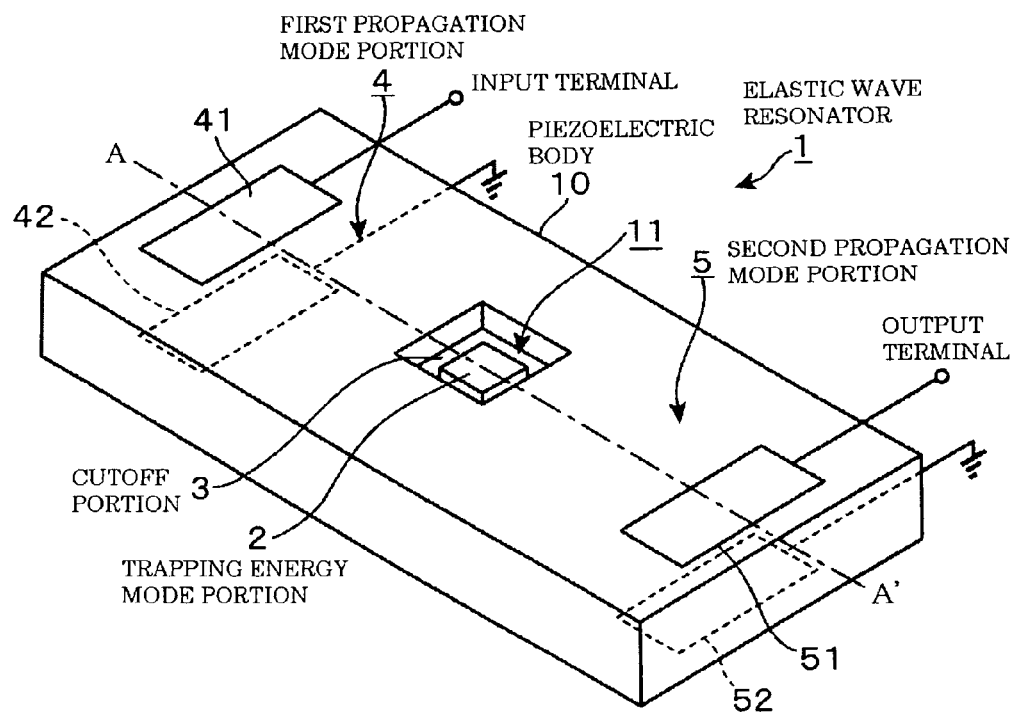
FIG. 1 is a perspective view illustrating an exterior constitution of an elastic wave resonator according to an embodiment.

Hereinafter, a constitution of an elastic wave resonator 1 being one example of an elastic wave device according to an embodiment will be explained with reference to FIG. 1 and FIG. 2. As illustrated in a perspective view in FIG. 1 and a vertical sectional side view in FIG. 2 (that illustrates a vertical cross section at positions of A-A' illustrated in FIG. 1), the elastic wave resonator 1 is constituted in a manner that electrodes 41, 42, 51, and 52 are provided at both ends of a piezoelectric body 10 being an elastic body material, which is processed to a small piece, to be set as an elastic wave waveguide through which elastic waves in propagation modes are propagated, and at, for example, a center portion on the elastic wave waveguide, a trapping energy mode portion 2 to excite an elastic wave in an energy trapping mode is provided. Here, the rectangular shaped electrodes 41, 42, 51, and 52 are illustrated in FIG. 1, and so on, but an electrode shape is not limited to the above example. Practically, if the rectangular shaped electrodes are employed, there is a fear that unwanted vibration is increased, and thus it is desirable to employ an electrode shape in which unwanted vibration is not increased. However, in this embodiment, the rectangular shaped electrodes 41, 42, 51, and 52 are illustrated for convenience.

The piezoelectric body 10 is an AT cut quartz-crystal piece, for example, and is processed in a manner that a length in an A-A' direction (that corresponds to a direction in which elastic waves in propagation modes propagate and will be called a longitudinal direction, hereinafter) illustrated in FIG. 1 is, for example, about several hundred μm to several mm, a length in a direction perpendicular to the A-A' direction, (which will be called a width direction, hereinafter), is, for example, about ⅓ to half of the length in the longitudinal direction, and a thickness (that is described as "$h_3$" in FIG. 2) is, for example, several ten μm to several hundred μm.

The electrodes 41, 42 provided at one ends on an A side in the A-A' direction illustrated in the drawings serve to electro-mechanically convert an input frequency signal and to excite elastic waves in propagation modes in the piezoelectric body 10. Each of the electrodes 41, 42 is a conductive thin film made of aluminum or chromium that is patterned to a rectangular shape, for example, and the electrode 41 is provided on an upper surface side of the piezoelectric body 10 and the electrode 42 is provided on a lower surface side of the piezoelectric body 10 to face to each other. In this example, the electrode 41 on the upper surface side is set as an input terminal of a frequency signal and the electrode 42 on the lower surface side is grounded, for example.

On the other hand, the electrodes 51, 52 provided at the other ends on an A' side serve to mechano-electrically convert the elastic waves propagated in the piezoelectric body 10 and to take them out as a frequency signal. These electrodes 51, 52 are constituted substantially similarly to the previously described electrodes 41, 42, and in this example, the electrode 51 on the upper surface side is set as an output terminal of the frequency signal and the electrode 52 on the lower surface side is set as a grounded end.

When a frequency signal is input to the electrode 41, elastic waves in various modes are excited in the piezoelectric body 10. However, this embodiment is constituted in a manner that resonance is obtained by using a first-order elastic wave or a higher-order elastic wave such as a second or higher-order elastic wave, out of elastic waves in propagation modes propagating in the piezoelectric body 10 (elastic wave waveguide) toward the electrodes 51, 52 on an output side, which are SH waves or Lamb waves, for example. Hereinafter, a first-order SH wave is cited as an example in this embodiment, and a detailed constitution thereof will be explained.

The trapping energy mode portion 2 and a cutoff portion 3 serve to mode-convert part of the first-order SH wave propagated in the piezoelectric body 10 and to excite an elastic wave in an energy trapping mode. The trapping energy mode portion 2 is a region where the elastic wave in the energy trapping mode is excited, and the cutoff portion 3 is a region to trap the above elastic wave in the trapping energy mode portion 2.

The trapping energy mode portion 2 is one region in the piezoelectric body 10 (elastic wave waveguide) processed to have a thickness "$h_1$" capable of exciting the elastic wave in the energy trapping mode at a previously is designed resonant frequency, and is provided at a substantially center position between the electrodes 41, 42 on an input side and the electrodes 51, 52 on the output side in this example. The trapping energy mode portion 2 is formed in a manner that a planar shape seen from, for example, the upper surface side is a square and one side thereof is, for example, about several hundred μm in length. The trapping energy mode portion 2 is disposed in a manner that two sides of the square, which face to each other, are parallel to a traveling direction of the first-order SH wave, (in other words, the first-order SH wave is input perpendicularly to the remaining two sides of the square).

Figure 2:
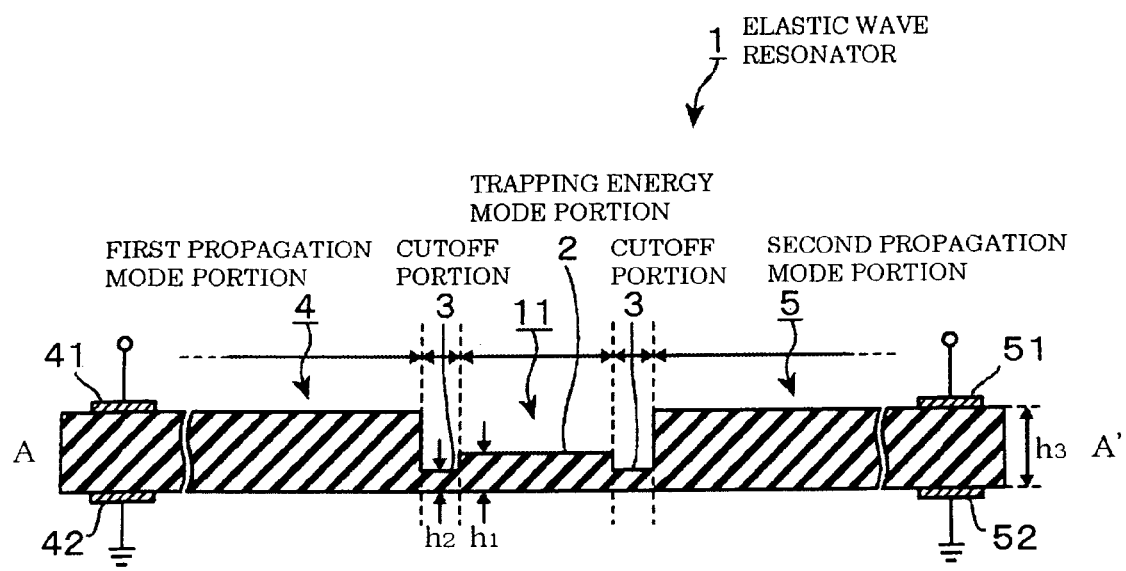
FIG. 2 is a vertical sectional side view of the elastic wave resonator.

The trapping energy mode portion 2 as illustrated in FIG. 1, FIG. 2, is provided in a recessed portion 11 formed at a center portion of the piezoelectric body 10, and is formed to project in a terrace shape (mesa shape) from a bottom surface of the recessed portion 11, (which corresponds to an upper surface of the cutoff portion 3). A rectangular parallelepiped portion ranging from an upper surface of a region projecting in a terrace shape to a rear surface of the piezoelectric body 10 corresponds to the trapping energy mode portion 2.

The cutoff portion 3 is one region in the piezoelectric body 10 (elastic wave waveguide), which is formed to surround the above-described trapping energy mode portion 2, and forms the recessed portion 11 integrally with the trapping energy mode portion 2. The upper surface of the cutoff portion 3 is the bottom surface of the recessed portion 11 formed one step lower than the trapping energy mode portion 2, and an angular ring-shaped portion ranging from the above upper surface to the rear surface of the piezoelectric body 10 corresponds to the cutoff portion 3.

Since the trapping energy mode portion 2 and the cutoff portion 3 are provided at the substantially center position of the piezoelectric body 10 as illustrated in FIG. 1, when seen from the trapping energy mode portion 2 and the cutoff portion 3, a region of the piezoelectric body 10 on an upstream side in a propagation direction of the first-order SH wave corresponds to a first propagation mode portion 4, and similarly a region on a downstream side thereof corresponds to a second propagation mode portion 5.

Here, as explained in DESCRIPTION OF THE RELATED ART, a conventional energy trapping type resonator achieves energy trapping in regions having electrodes provided thereon by using a mass loading effect of the electrodes. In contrast, in the trapping energy mode portion 2 and the cutoff portion 3 according to this embodiment, the respective regions are formed in a manner that the thickness "$h_1$" of the trapping energy mode portion 2 is thicker than a thickness "$h_2$" of the cutoff portion 3 as illustrated in FIG. 2, for example, and thereby the elastic wave resonator 1 has a significant characteristic with regard to a point on which energy trapping in the trapping energy mode portion 2 is achieved by making a resonant frequency of thickness vibration in the trapping energy mode portion 2 lower than a cutoff frequency in the cutoff portion 3.

Sizes of the trapping energy mode portion 2 and the cutoff portion 3 are illustrated in an exaggerated manner in each of the drawings such as FIG. 1, FIG. 2, in order to make a state where the trapping energy mode portion 2 projects in a terrace shape from the bottom surface of the recessed portion 11 understandable, but the elastic wave resonator 1 whose resonant frequency is, for example, approximately 100 MHz is constituted as an extremely small-sized device such that the thicknesses "$h_1$", "$h_2$" of the regions of the trapping energy mode portion 2 and the cutoff portion 3 in the piezoelectric body 10 are about ten odds μm, and further a difference between the thicknesses of the trapping energy mode portion 2 and the cutoff portion 3, namely a height of the portion projecting in a terrace shape is, for example, about ten odds nm. Further, at a resonant frequency that is a higher frequency such as a gigahertz, the thicknesses "$h_1$", "$h_2$" of the trapping energy mode portion 2 and the cutoff portion 3 and the height of the terrace are further reduced.

Figure 3:
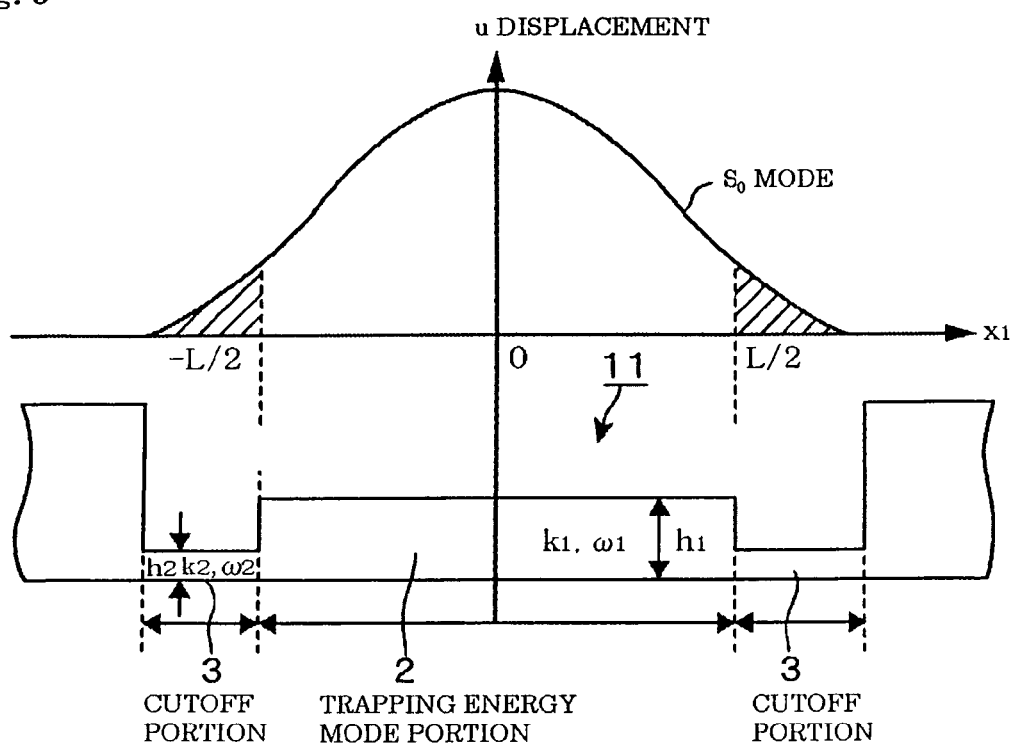
FIG. 3 is a schematic view illustrating how an elastic wave in an energy trapping mode is excited in the elastic wave resonator.

There will be explained one example of a designing method to determine the sizes of the trapping energy mode portion 2 and the cutoff portion 3. When standing waves of a thickness vibration wave whose wavelength is n/2 (n is an integer) are generated in the trapping energy mode portion 2 and the cutoff portion 3 having the thicknesses "$h_1$", "$h_2$" respectively as illustrated in FIG. 3, it is possible to express a relationship between a cutoff frequency "$\omega_1$" in the trapping energy mode portion 2 and the thickness "$h_1$" by the following expression (1), and to express a relationship between an angular frequency "$\omega$" of the standing wave to be formed in the trapping energy mode portion 2 and a wave number thereof by the following expression (2).

[Numerical Expression 1]

$$\omega_1 = \frac{n\pi v_p}{h_1} \quad (1)$$

$v_p$ is a velocity of a plane wave propagating in a thickness direction.

[Numerical Expression 2]

$$k_1 = \frac{1}{\beta v_p}\sqrt{\omega^2 - \omega_1^2} \quad (2)$$

β is a constant determined by a piezoelectric material or a propagation mode.

Further, it is possible to express a relationship between a cutoff angular frequency "$\omega_2$" in the cutoff portion 3 and the thickness "$h_2$" by the following expression (3), and to express a relationship between an angular frequency "$\omega$" of the standing wave to be formed in the cutoff portion 3 and a wave number thereof by the following expression (4).

[Numerical Expression 3]

$$\omega_2 = \frac{n\pi v_p}{h_2} \quad (3)$$

[Numerical Expression 4]

$$k_2 = \frac{-j}{\beta v_p}\sqrt{\omega_2^2 - \omega^2} \quad (4)$$

j is an imaginary number.

At this time, as schematically illustrated in FIG. 3, when a thickness vibration wave in an $S_0$ mode (a symmetric mode) being the energy trapping mode is excited in the trapping energy mode portion 2, a resonant angular frequency $\omega_R$ thereof falls within a range of $\omega_1 < \omega_R < \omega_2$. At this time, when an approximate expression to express displacement u of the thickness vibration wave each excited in the trapping energy mode portion 2 and the cutoff portion 3 is made and a condition that the displacement and an inclination of the displacement in an $x_1$ direction are continuous in boundaries between the trapping energy mode portion 2 and the cutoff portion 3 is satisfied, as for wave numbers $k_1$, $k_2$ to be specified in the above-described expressions (2), (4), a relationship of the following expression (5) is established.

[Numerical Expression 5]

$$k_1 \tan\frac{k_1}{L} = jk_2 \quad (5)$$

L is the length of the trapping energy mode portion 2 in the longitudinal direction (A-A' direction).

As described above, in the expressions (1) to (4), the angular frequency "$\omega$" of the standing wave satisfying a condition of the expression (5) corresponds to the resonant angular frequency "$\omega_R$".

A piezoelectric material to constitute the piezoelectric body 10 is selected according to the relationships explained above, and the resonant angular frequency "$\omega_R$" of the elastic wave resonator 1 is set to thereby obtain the thickness "$h_1$" and the length "L" of the trapping energy mode portion 2 and the thickness "$h_2$" of the cutoff portion 3, which enable the above resonant angular frequency to be obtained, by, for example, trial and error, by the expressions (1) to (5), and thereby the sizes of the trapping energy mode portion 2 and the cutoff portion 3 can be determined. Note that in the above-described designing method, one example of a way to obtain the sizes of the trapping energy mode portion 2 and the cutoff portion 3 is schematically described, and the elastic wave resonator 1 according to this embodiment is not limited to the trapping energy mode portion 2 and the cutoff portion 3 designed by the above designing method. It is a matter of course that by using, for example, a simulator or the like, a condition capable of obtaining resonance in the trapping energy mode at the designed resonant angular frequency "$\omega_R$" is searched, and thereby the sizes of the trapping energy mode portion 2 and the cutoff portion 3 may be determined. Further, if a structure simulator capable of calculating a frequency characteristic in an arbitrary shape such as a finite element method is used at this time, it is possible to design the trapping energy mode portion 2 and the cutoff portion 3 simply.

As explained above, in the elastic wave resonator 1 according to this embodiment, the trapping energy mode portion 2 and the cutoff portion 3 to obtain resonance in the energy trapping mode can be constituted in an extremely small size and thin.

Operation of the elastic wave resonator 1 provided with the constitution explained above will be explained. At present, when a frequency signal is input to the electrode 41 on the input side, the frequency signal, in the piezoelectric body 10, is electro-mechanically converted to excite elastic waves in various modes. Among them, for example, the first-order SH wave to propagate in the piezoelectric body 10 is included.

Figure 4:
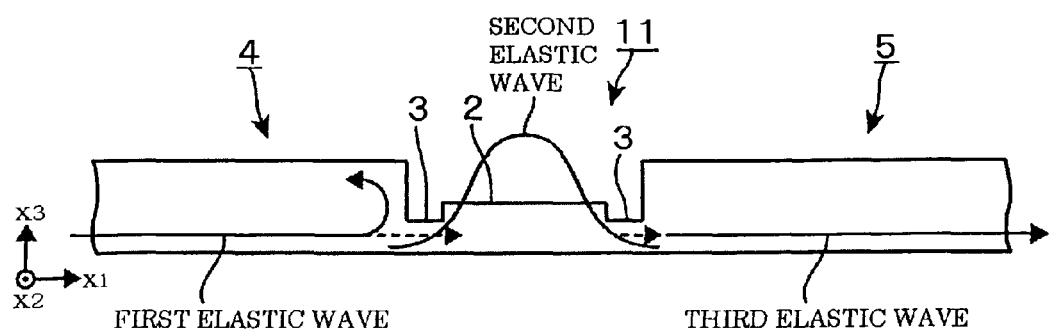
FIG. 4 is a schematic view illustrating how in the elastic wave resonator, a first-order SH wave propagates and the elastic wave in the energy trapping mode is excited.

As schematically illustrated in FIG. 4, the above first-order SH wave is an elastic wave in a propagation mode propagating in the $x_1$ direction (longitudinal direction, A-A' direction) in the drawing, and the first-order SH wave excited in the electrodes 41, 42 on the input side, (which will be called a first elastic wave, hereinafter), propagates in the first propagation mode portion 4 in the longitudinal direction. The above first elastic wave later reaches the recessed portion 11 having the cutoff portion 3 and the trapping energy mode portion 2 formed therein, but most of the first elastic wave is reflected on a sidewall surface of the recessed portion 11.

However, part of the first elastic wave, which is not reflected on the sidewall surface of the recessed portion 11, passes through the cutoff portion 3 and reaches the trapping energy mode portion 2. At this time, in the case when a frequency component capable of exciting the elastic wave in the trapping energy mode in the trapping energy mode portion 2 is included in the first elastic wave that reaches the trapping energy mode portion 2, the first elastic wave is mode-converted to the elastic wave in the energy trapping mode, (which will be called a second elastic wave, hereinafter), in the trapping energy mode portion 2, and resonance schematically illustrated in FIG. 3 and FIG. 4 occurs.

With respect to the second elastic wave excited in the trapping energy mode portion 2, the cutoff portion 3 formed in the periphery of the trapping energy mode portion 2 has a cutoff frequency being a frequency higher than that of the second elastic wave, so that energy that the second elastic wave has is brought into a state where it is trapped in the trapping energy mode portion 2. However, the vibration energy of the second elastic wave is not brought into an off state of its on/off in the cutoff portion 3 in a rectangular function manner, but it is attenuated exponentially as illustrated in FIG. 3, FIG. 4.

Therefore, the vibration energy of the part of the second elastic wave leaks into an outside region through the cutoff portion 3 and is converted to an elastic wave in a new propagation mode. Then, the above new elastic wave converted to the propagation mode (the first-order SH wave, for example), (which will be called a third elastic wave, hereinafter), propagates through the second propagation mode portion 5 to reach the electrodes 51, 52 on the output side. As a result, in the electrodes 51, 52 on the output side, a frequency signal corresponding to a frequency input by mechano-electrical conversion is taken out.

Figure 5:
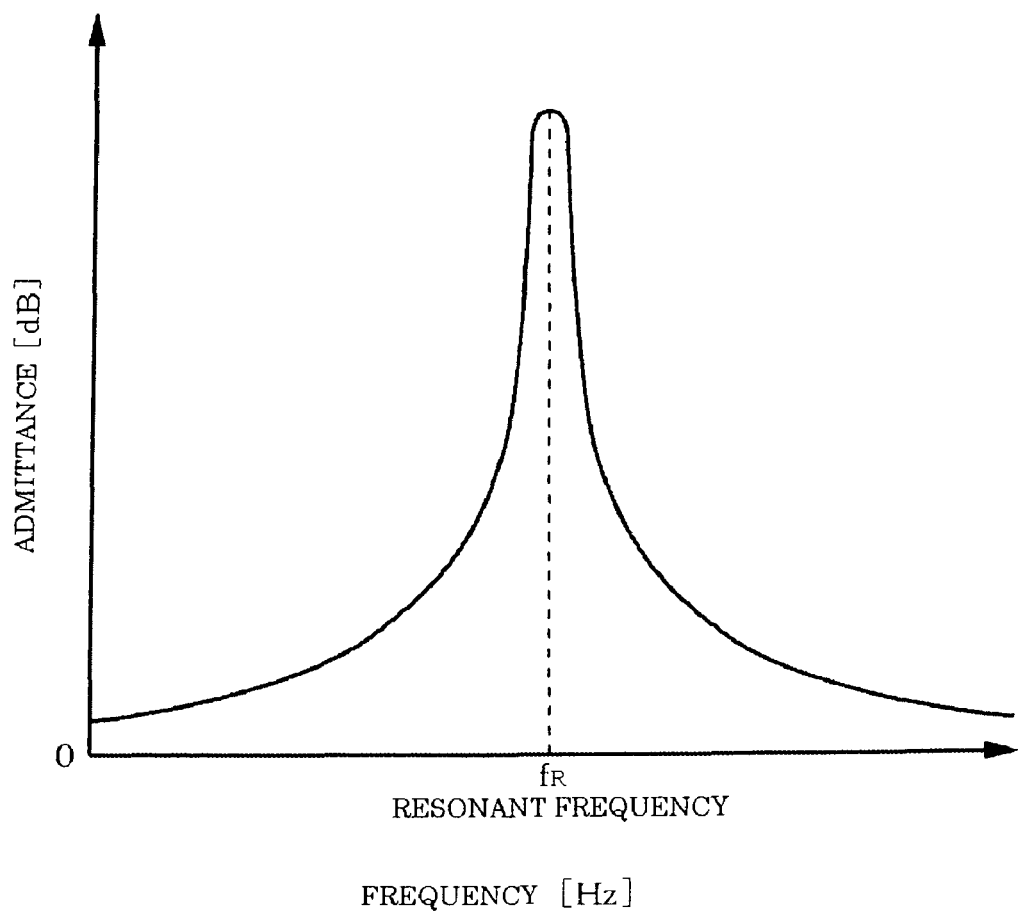
FIG. 5 is a view of a frequency characteristic expected to be exhibited by the elastic wave resonator.

Here, the second elastic wave to be excited in the trapping energy mode portion 2 by resonance has large vibration energy. Therefore, although the vibration energy is attenuated exponentially in the cutoff portion 3, the third elastic wave has large vibration energy compared to the first elastic wave. Accordingly, the elastic wave resonator 1 according to this embodiment is expected to exhibit a frequency characteristic in which an admittance is made maximum at a resonant frequency "$f_R$" as illustrated in FIG. 5, and can perform frequency control and frequency selection by using the above frequency characteristic.

Next, there will be explained one example of a method of manufacturing the elastic wave resonator 1 according to this embodiment with reference to FIG. 6(a) to FIG. 6(f). First, a resist 60 is coated on a front surface of the piezoelectric body 10 (FIG. 6(a)), and the resist 60 is patterned correspondingly to a planar shape of the recessed portion 11 (FIG. 6(b)). Then, the front surface of the piezoelectric body 10 is shaved to, for example, a height position corresponding to the upper surface of the trapping energy mode portion 2 by using anisotropic etching such as dry etching, for example, to form the recessed portion 11 (FIG. 6(c)).

Figure 6:
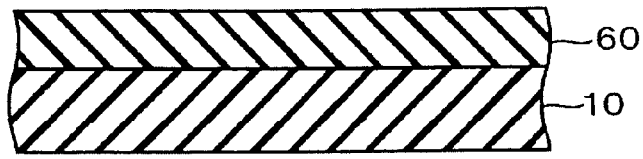
FIG. 6(*a*) to FIG. 6(*f*) are explanatory views illustrating processes of manufacturing the elastic wave resonator.
Figure 6:
Figure 6:
Figure 6:
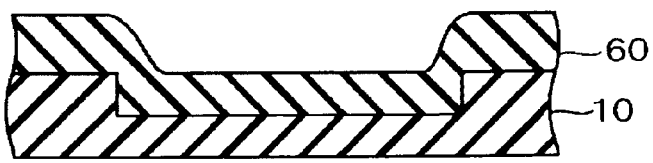
Figure 6:
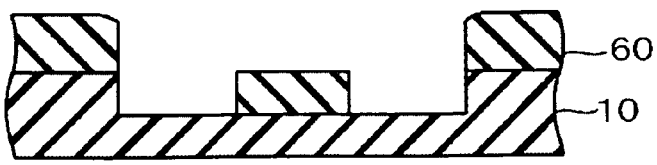
Figure 6:
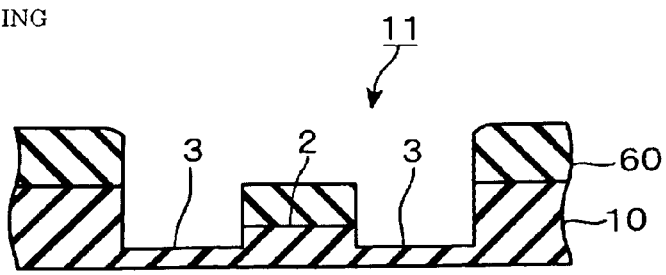

Next, the resist 60 is coated on an upper surface side of the piezoelectric body 10 again (FIG. 6(d)), and in order to make the trapping energy mode portion 2 project in a terrace shape, a peripheral region of the trapping energy mode portion 2 is patterned to an angular ring shape and then to expose a region to be formed as the cutoff portion 3 (FIG. 6(e)). Then, an exposed portion is shaved again by dry etching or the like, to form the trapping energy mode portion 2 and the cutoff portion 3 (FIG. 6(f)). Then, the electrodes 41, 42, 51, and 52 are formed by a method such as, for example, lift-off, and the elastic wave resonator 1 provided with the previously described constitution is obtained.

The elastic wave resonator 1 according to this embodiment has the following effect. The first elastic wave in the first or higher-order propagation mode is propagated in the piezoelectric body 10 and the second elastic wave in the energy trapping mode is excited by a specific frequency component included in the first elastic wave in the trapping energy mode portion 2 whose periphery is surrounded by the cutoff portion 3, and thereby a resonance response can be obtained without providing an electrode on the trapping energy mode portion. Therefore, a change in a frequency characteristic due to a mass change in an electrode does not occur in the trapping energy mode portion 2, so that an elastic wave device in which further miniaturization thereof is easy to be performed and a frequency fluctuation due to aging hardly occurs can be obtained.

Here, in the elastic wave resonator 1, the electrodes 41, 42, 51, and 52 are provided on the input side and the output side of a frequency signal respectively. However, even when these electrodes 41, 42, 51, and 52 oxidize or corrode to cause a change in their masses, the first elastic wave (the elastic wave in the first or higher-order propagation mode) to be excited in the piezoelectric body 10 is little affected by the change. Then, the trapping energy mode portion 2 and the cutoff portion 3 where resonance occurs are provided completely independently of the electrodes 41, 42, 51, and 52, and are not affected by the change in their masses, so that a resonant frequency does not change with time and a stable frequency characteristic is exhibited.

Figure 7:
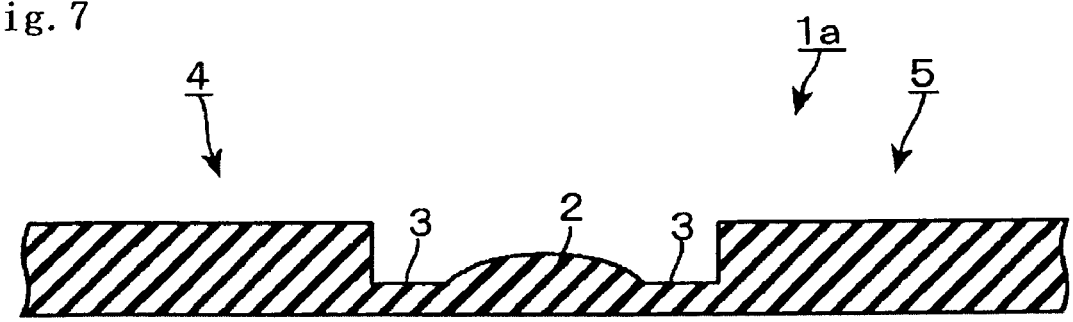
FIG. 7 is a vertical sectional side view of an elastic wave resonator in which a cross sectional shape of a trapping energy mode portion is formed in a plano-convex lens shape.

The cross-sectional shape of the trapping energy mode portion 2, as illustrated in FIG. 2, FIG. 3, and so on, is not limited to the case when it is formed in a rectangular shape, and as illustrated in an elastic wave resonator 1a in FIG. 7, for example, a trapping energy mode portion 2 may also be formed in a plano-convex lens (plano-convex) shape. As illustrated in FIG. 3, the energy trapping mode being, for example, the $S_0$ mode exhibits a bell-shaped displacement distribution, and thus when the trapping energy mode portion 2 is formed in a shape corresponding to the above displacement distribution, the elastic wave in the energy trapping mode (the second elastic wave) can be excited efficiently. In the above case, the plano-convex lens shape may be formed in a manner to form an image sensor of a CCD (Charged Coupled Device). Further, it is a matter of course that the trapping energy mode portion 2 is not limited to the plano-convex lens shape, and it may also be formed in a biconvex lens (biconvex) shape.

Figure 8:
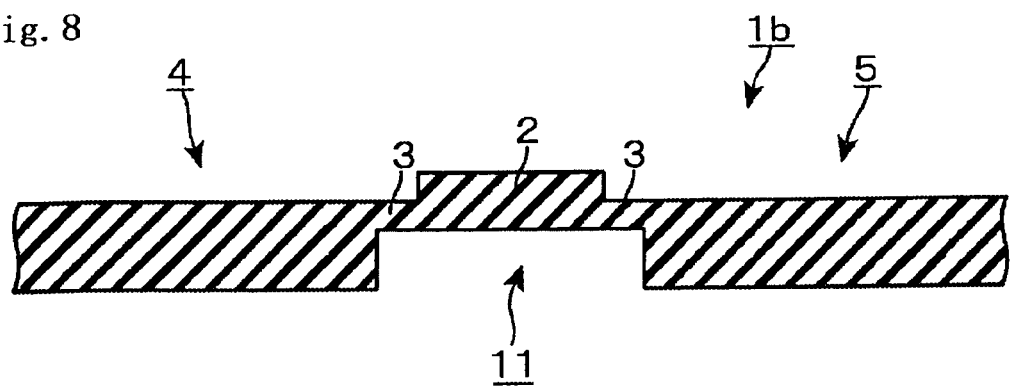
FIG. 8 is a vertical sectional side view of an elastic wave resonator having a recessed portion provided on a rear surface of a piezoelectric body.
Figure 9:
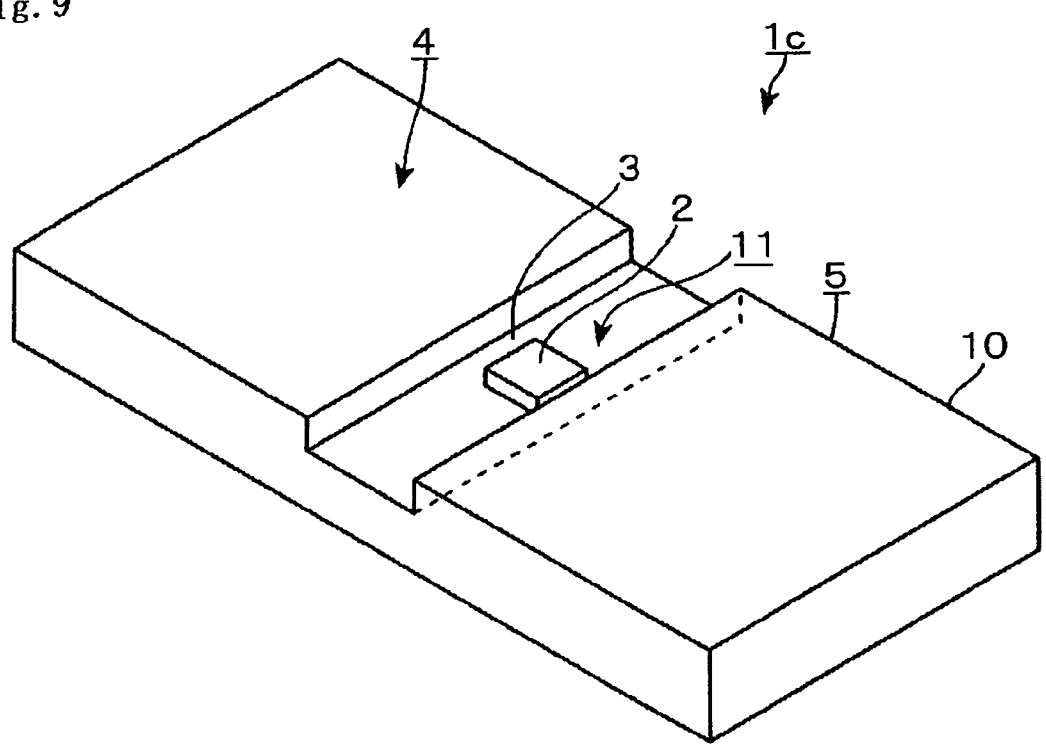
FIG. 9 is a perspective view illustrating another example of a recessed portion shape.

Further, a recessed portion 11, as illustrated in an elastic wave resonator 1b in FIG. 8, may also be formed on a rear surface side of a piezoelectric body 10, and further a recessed portion 11, as illustrated in an elastic wave resonator 1c in FIG. 9, may also be formed to cross an entire rear surface side of a region having a trapping energy mode portion 2 and a cutoff portion 3 provided therein of a piezoelectric body 10.

Figure 10:
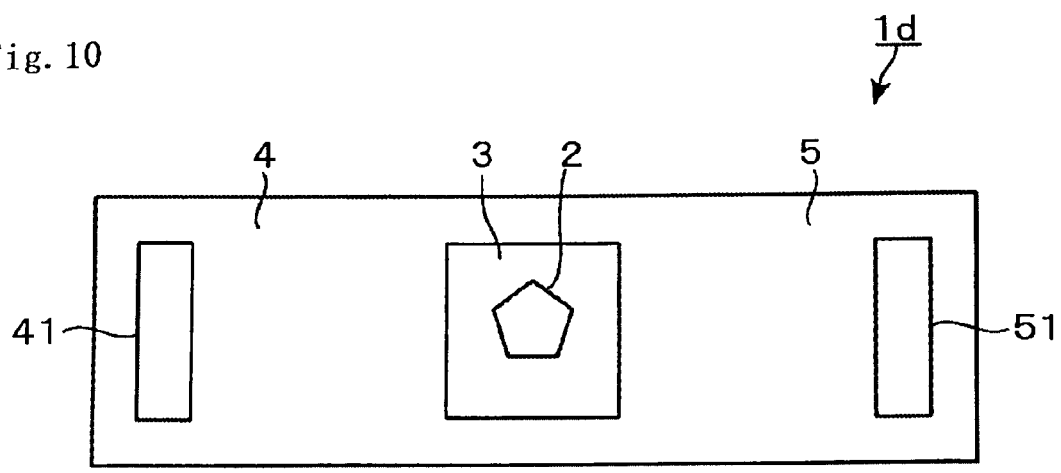
FIG. 10 is a plane view illustrating another example of a planar shape of the trapping energy mode portion.
Figure 11:
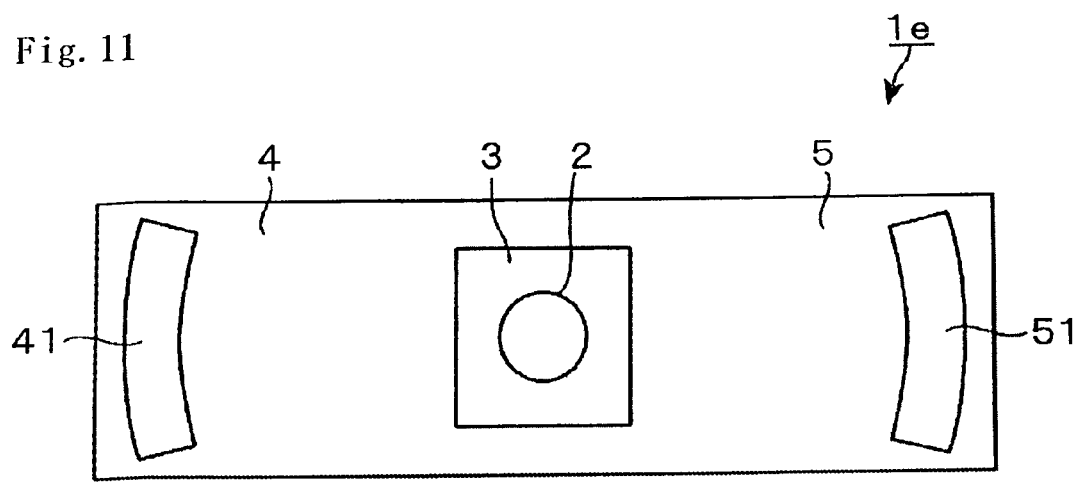
FIG. 11 is a plane view illustrating still another example of the planar shape.
Figure 12:
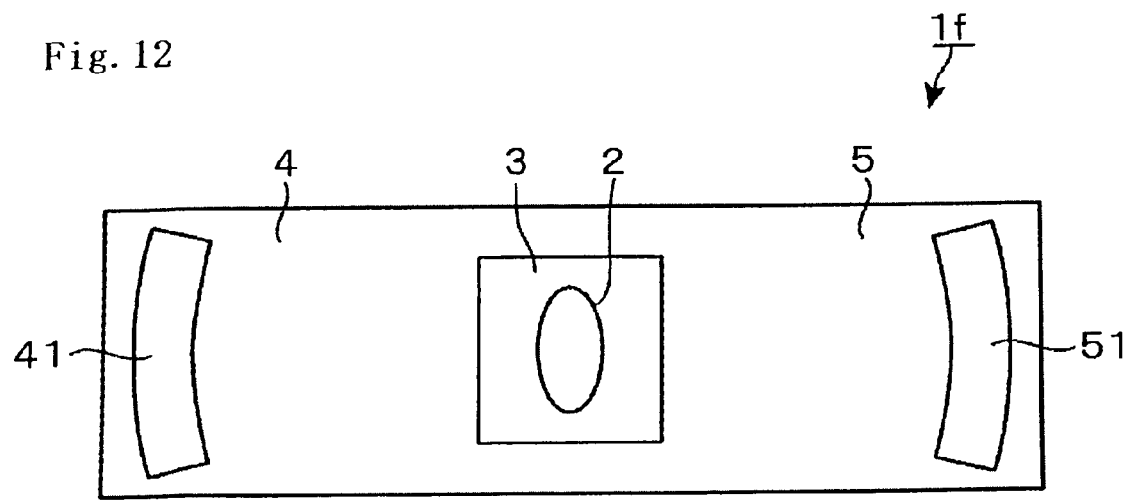
FIG. 12 is a plane view illustrating an example of the planar shape besides the above.

The planar shape of the trapping energy mode portion 2 is also not limited to a quadrangle such as the square or a rectangle, and as is an elastic wave resonator 1d in FIG. 10, it may also be a pentagon or a polygon with more than five sides, a circle (an elastic wave resonator 1e in FIG. 11), or an ellipse (an elastic wave resonator 1f in FIG. 12). In the case of the polygon, such as the previously described quadrangle, or a hexagon, if the trapping energy mode portion 2 is formed in a manner that respective sides of the planar shape come to the same dispositions in the case when the trapping energy mode portion 2 is rotated to 180° seen from the upper surface side as well, it is efficient to excite the elastic wave in the energy trapping mode. However, the above does not exclude the case when the planar shape of the trapping energy mode portion 2 is formed in a polygon having an odd number of sides such as a triangle. Further, in these cases, as illustrated in the elastic wave resonators 1e and 1f in FIG. 11 and FIG. 12, for example, the elastic wave resonator 1 may also be constituted in a manner that planar shapes of electrodes 41, 42, 51, and 52 are formed in an arc shape, and the elastic wave in the first or higher-order propagation mode (the first elastic wave) is made substantially perpendicularly incident on a trapping energy mode portion 2 whose planar shape is formed in a circle or an ellipse.

Figure 13:
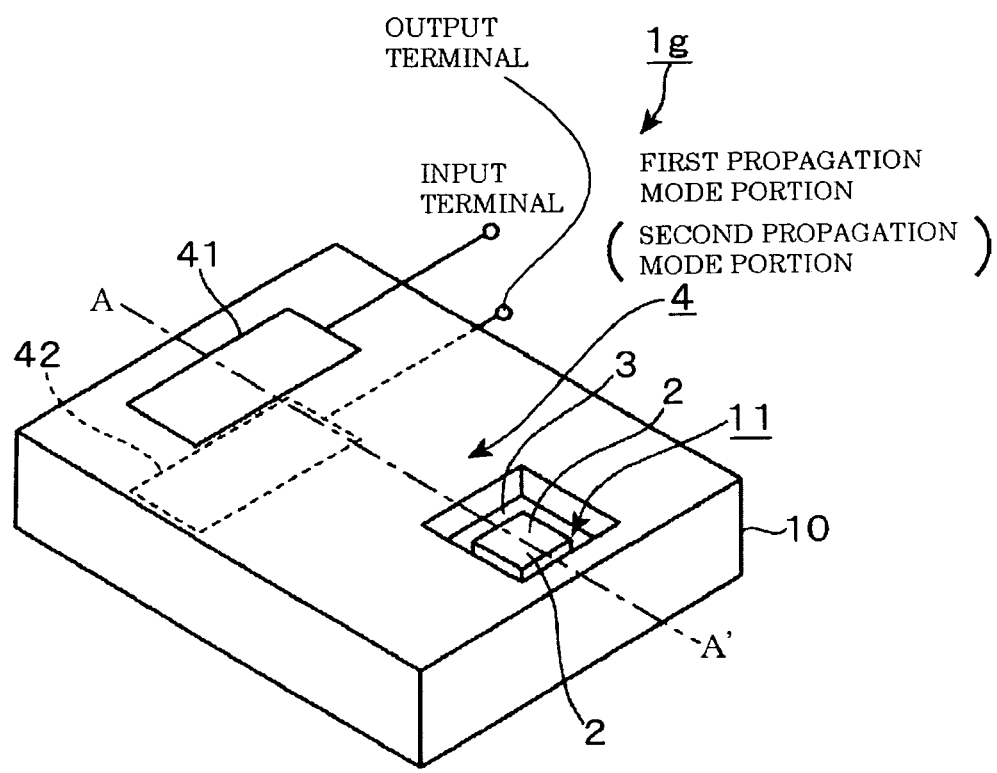
FIG. 13 is a perspective view illustrating an elastic wave resonator having an elastic wave waveguide provided only on one side of a trapping energy mode portion.

Further, in the embodiments illustrated in FIG. 1, and so on, there is described an example where the first propagation mode portion 4 and the second propagation mode portion 5 are formed to sandwich the trapping energy mode portion 2 and the cutoff portion 3 and the electrodes 41, 42 for input are provided at both the ends on the first propagation mode portion 4 and the electrodes 51, 52 for output are provided at both the ends on the second propagation mode portion 5 respectively, but the embodiment may also be constituted in a manner that the first propagation mode portion 4 is used as a second propagation mode portion. In the above case, such as an elastic wave resonator 1g illustrated in FIG. 13, it is preferable that as for electrodes 41 and 42 provided on an upper surface and a lower surface of a first propagation mode portion 4 side, the electrode 41 on one side is set as the electrode 41 for input of a frequency signal and the electrode 42 on the other side is set as the electrode 42 for output of the frequency signal, resulting that the elastic wave resonator 1g can be further miniaturized.

Figure 14:
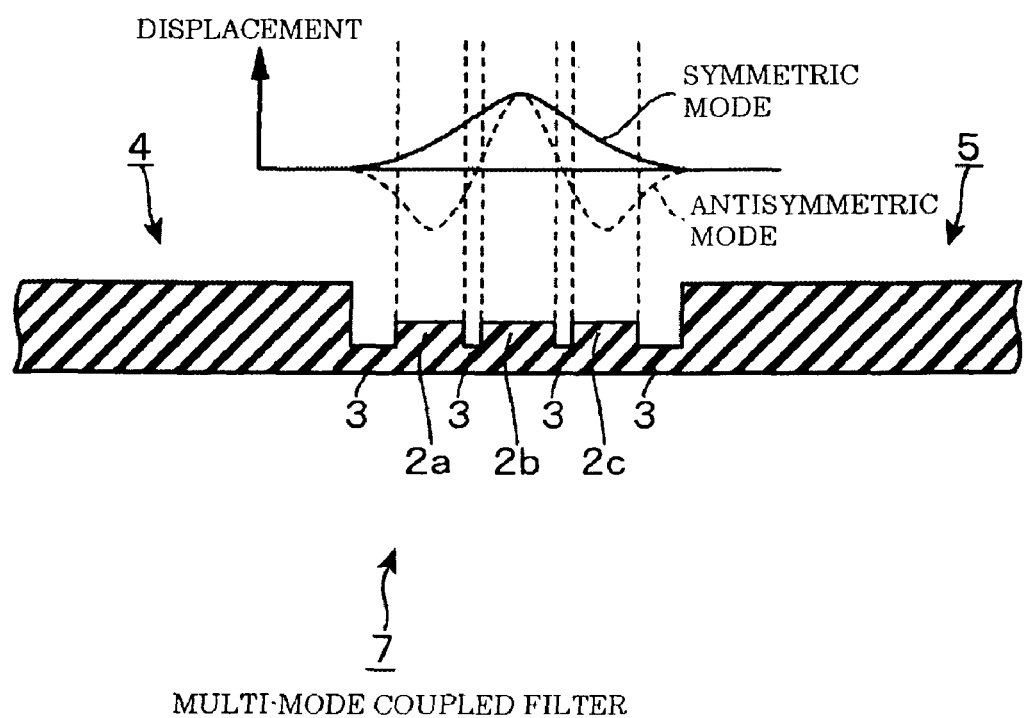
FIG. 14 is a vertical sectional side view illustrating a constitution example of a multi-mode coupled filter according to an embodiment.

In FIG. 14, there is illustrated an example where a multi-mode coupled filter 7 is constituted by using the elastic wave in the energy trapping mode oscillated by the above-described principle. As for the trapping energy mode portion 2, a plurality of trapping energy mode portions whose peripheries are surrounded by a cutoff portion 3, which are, for example, three trapping energy mode portions 2a, 2b, and 2c, are provided in a longitudinal direction to be adjacent to one another, and intervals of these trapping energy mode portions 2a, 2b, and 2c are adjusted to a distance with such a degree that the energy trapping modes (second elastic waves) to be excited in the respective trapping energy mode portions 2a, 2b, and 2c generate mode coupling. As a result, it is possible to constitute a band filter by using a difference between resonant frequencies of coupled modes (a symmetric mode and an antisymmetric mode, for example) to be excited in the trapping energy mode portions 2a, 2b, and 2c. The number of the trapping energy mode portions 2 to be provided in the multi-mode coupled filter 7 is not limited to the case of three, and it may also be, for example, two.

Further, an example where the elastic wave resonator 1 illustrated in FIG. 1, and so on, is provided with the electrodes 41, 42, 51, and 52 for input/output of a frequency signal is described, but the elastic wave device according to the present invention does not always have to be provided with these electrodes 41, 42, 51, and 52. The case when an electrode portion is provided in, for example, an insert-type cartridge, and the elastic wave device according to the present invention, where an electrode portion is not provided, (which is an elastic wave device where the electrodes 41, 42, 51, and 52 are eliminated from the elastic wave resonator 1 illustrated in FIG. 1, for example) is connected to the above cartridge to thereby constitute an oscillation circuit or the like, is also included in the technical scope of the present invention.

Further, the first propagation mode portion 4 and the second propagation mode portion 5 are not limited to the case when they are formed thicker than the cutoff portion 3. For example, a trapping energy mode portion 2 projecting in a terrace shape may also be provided in a piezoelectric body 10 formed to have the thickness "$h_2$" of the cutoff portion 3. In the above case, for example, electrodes 41, 42, 51, and 52 are provided at intervals corresponding to a cutoff portion 3 in a periphery of the trapping energy mode portion 2, thereby propagating the elastic wave in the first or higher-order propagation mode (the first elastic wave) excited in the electrodes 41, 42 on an input side to the trapping energy mode portion 2 through the cutoff portion 3. This makes it possible to excite the elastic wave in the energy trapping mode (the second elastic wave). Then, the elastic wave leaked from the trapping energy mode portion 2 through the cutoff portion 3 and again converted to the propagation mode, (which is the third elastic wave), is taken out as a frequency signal in the electrodes 51, 52 on an output side, and thereby operation and effect similar to those of the above-described embodiments can be obtained. In the case of this example, a region having the electrodes 41, 42 provided thereon corresponds to the first propagation mode portion and a region having the electrodes 51, 52 provided thereon corresponds to the second propagation mode portion.

The elastic wave resonators 1, 1a to 1g explained above are each incorporated in, for example, a well-known Colpitts circuit, and thereby it is used as an oscillator. Further, the multi-mode coupled filter 7 is used as an electronic component such as a band filter in itself.

Further, the piezoelectric material of the piezoelectric body 10 is not limited to the quartz-crystal, and it may also be, for example, lithium tantalate, lithium niobate, langasite, or the like, and the elastic wave in the propagation mode to be used as the first elastic wave may also be not only the first-order SH wave but also a second or higher-order harmonic, and further it may also be a Lamb wave or the like except the SH wave.

Besides the above, the elastic body material constituting the elastic wave waveguide is not limited to the case when the piezoelectric body such as quartz-crystal is employed, and the case when, for example, a non-piezoelectric body such as titanium or stainless steel being a metallic material with a corrosion resistance is employed is also included in the technical scope of the present invention. In the above case, when the first propagation mode portion 4 is pulse-irradiated with, for example, a laser beam, or is irradiated with a light intensity modulated laser beam, or the like, for example, the first elastic wave of the elastic wave in the first or higher-order propagation mode can be excited in the first propagation mode portion 4. Further, when the elastic wave waveguide is constituted by a non-piezoelectric body material as described above, the third elastic wave that is is leaked from the trapping energy mode portion 2 to propagate through the second propagation mode portion 5 can be detected by a Doppler type vibration meter irradiating the second propagation mode portion 5 with, for example, a laser beam, or the like. These irradiation methods of a laser beam are not limited to a specific method, but laser beam irradiation may also be performed through, for example, an optical fiber. Further, the excitation of the first elastic wave by these laser beams and the detection of the third elastic wave by a laser type vibration meter are also applicable to the case when the elastic body material constituting the elastic wave waveguide is the piezoelectric body.

Figure 15:
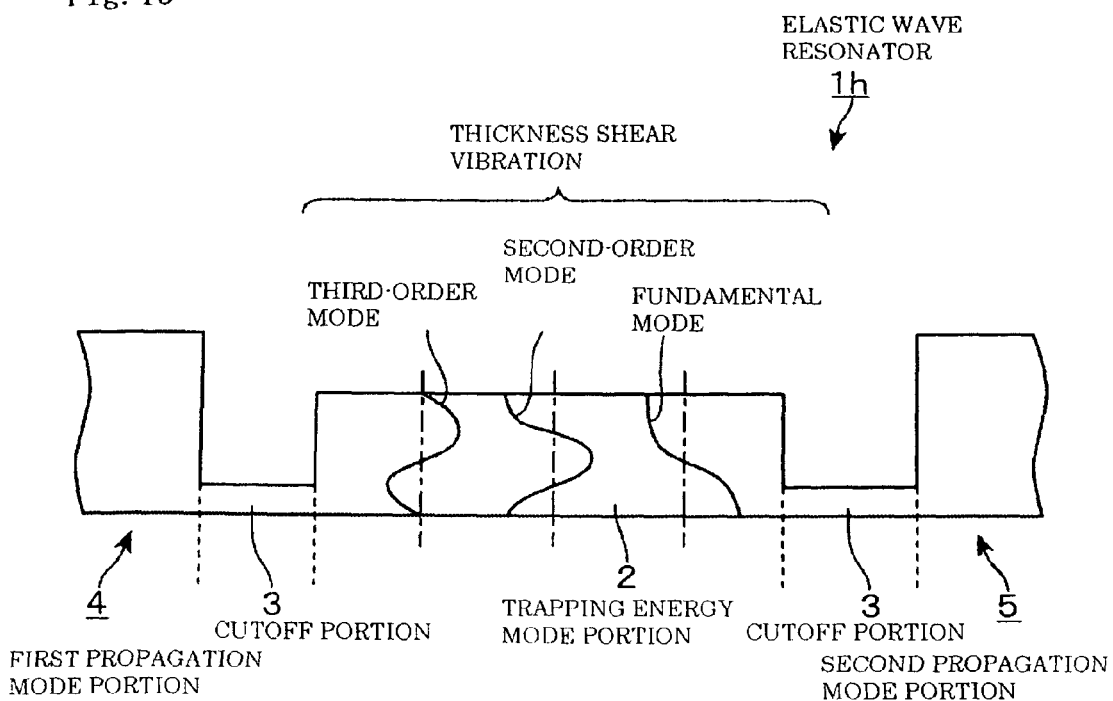
FIG. 15 is a side view of an elastic wave resonator using high-order thickness shear vibrations.

Furthermore, the energy trapping mode usable in the elastic wave resonator 1 of the present invention is not limited to the case when the energy trapping mode of thickness extensional vibration in which the displacement in the thickness direction of the elastic wave resonator 1 has a distribution in the longitudinal direction as illustrated in FIG. 3 is used. An energy trapping mode of, for example, thickness shear vibration with displacement in the longitudinal direction of the elastic wave resonator 1, or of thickness torsional vibration with displacement in the width direction of the elastic wave resonator 1, may also be used. For example, FIG. 15 is an example schematically illustrating an elastic wave resonator 1h using the energy trapping mode of the thickness shear vibration. As illustrated in the drawing, the order of the energy trapping mode is also not limited to the case when a minimum-order mode (a fundamental mode in the example of FIG. 15) is used, and a higher-order energy trapping mode may also be used. Particularly, when remote excitation without using excitation electrodes such as the previously described laser beam irradiation is employed, it is also possible to excite energy trapping modes of not only odd number-order modes (the fundamental mode, a third-order mode, . . . ) but also even number-order modes (a second-order mode, . . . ), and these even number-order modes are also included in the higher-order second elastic wave.

As for a method to design the trapping energy mode portion 2 capable of exciting the high-order energy trapping modes, the case in which a simulation is performed by appropriately changing the thicknesses "$h_1$", "$h_2$" of the trapping energy mode portion 2 and the cutoff portion 3, the length "L" of the trapping energy mode portion 2, selection of a material, a crystal direction of the material, and so on, to thereby search a condition that an energy trapping mode of a targeted order is excited, or the like can be considered.

Incidentally, when the electrodes 41, 42, 51, and 52 for excitation are used, an electromechanical coupling coefficient between the piezoelectric body 10 and the electrodes 41, 42, 51, and 52 is reduced in inverse proportion to a square of the order of the energy trapping mode, and thus the electrodes 41, 42, 51, and 52 become an obstacle to using the high-order energy trapping modes. In contrast, if the remote excitation is used, there is an advantage that a problem of the reduction in the electromechanical coupling coefficient is eliminated, and thereby the high-order energy trapping modes can be used.

Further, in the case when the thickness shear vibration is used, the thickness "$h_1$" of the trapping energy mode portion 2 becomes thicker as the order of the energy trapping mode becomes higher, so that manufacturing and handling of the elastic wave resonator 1 become easy to be performed compared to the case when, for example, the minimum-order mode is used. Further, since it is possible to thicken the trapping energy mode portion 2 as described above, a ratio "V/S" of a volume V of the trapping energy mode portion 2 to a surface area S of both the upper and lower surfaces of the trapping energy mode portion 2 can be taken large. Even in the case when the elastic wave waveguide is constituted by, for example, a non-piezoelectric body material that is likely to deteriorate with time, or the like, it is possible to suppress a change in a resonant frequency of the energy trapping mode accompanied by a volume change due to deterioration with time, or the like when a value of "V/S" is increased. In addition to these, when the remote excitation is used, it is also possible to prevent thermal strain generated during processing in providing the electrodes 41, 42, 51, and 52 on the piezoelectric body 10 and deterioration with time of the electrodes 41, 42, 51, and 52 themselves. Further, the high-order energy trapping modes usable in the elastic wave resonator of the present invention are not limited to the example of the thickness shear vibration illustrated in FIG. 15, and it is a matter of course that high-order energy tapping modes of the thickness extensional vibration or the thickness torsional vibration may also be used.

Figure 16:
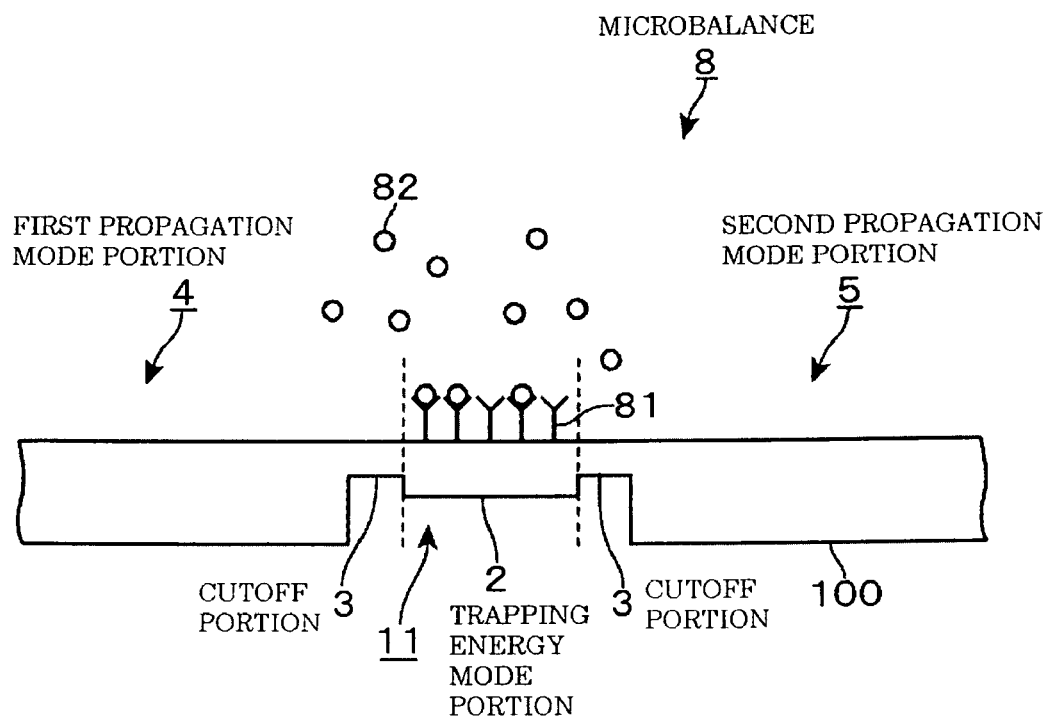
FIG. 16 is a side view illustrating a constitution example of a microbalance according to an embodiment.

Next, in FIG. 16, there will be illustrated an example where a microbalance 8 is constituted by using an elastic wave waveguide 100, (which may be a piezoelectric body or a non-piezoelectric body), in an embodiment. As for the microbalance, a QCM (Quartz Crystal Microbalance) in which a change in a natural frequency ascribable to adsorption of a substance to be sensed to a quartz-crystal vibrator is detected to specify an adsorption amount of the substance to be sensed, or the like has been known, but the microbalance 8 according to this example specifies an adsorption amount of a substance to be sensed by using a change in a resonant frequency of the energy trapping mode. The microbalance 8 illustrated in FIG. 16, similarly to the elastic wave resonator 1 illustrated in the drawings, for example, has a projecting portion in a terrace shape of a trapping energy mode portion 2 provided in a recessed portion 11. Accordingly, on a surface opposite the projecting portion, a flat surface without concavity and convexity is formed from a first propagation mode portion 4 to a second propagation mode portion 5.

Then, on a region corresponding to the trapping energy mode portion 2 of the above, flat surface, an adsorption layer 81 to adsorb a substance to be sensed 82 is provided. When a specific antigen in blood or serum, or the like is sensed as the substance to be sensed 82, for example, an antibody selectively reacting with and binding to the substance to be sensed 82, or the like, is used for the adsorption layer 81. Then, when the substance to be sensed 82 is adsorbed to the above adsorption layer 81, by a mass loading effect, a thickness of the trapping energy mode portion 2 apparently increases in view of a high likelihood of vibration. As a result, a cutoff frequency of the trapping energy mode portion 2 is reduced. A resonant frequency of the energy trapping mode is also reduced in proportion to the above reduction in the cutoff frequency, so that it is possible to specify an amount of the substance to be sensed 82 adsorbed to the adsorption layer 81 based on a correspondence relation between a reduction amount of the resonant frequency and an adsorption amount of the substance to be sensed 82.

In the example of the microbalance 8 illustrated in FIG. 16, when the remote excitation by, for example, a laser beam, or the like, is used, there is no need to provide electrodes 41, 42, 51, and 52 for excitation on a front surface of the elastic wave waveguide 100, so that it also becomes possible to measure corrosive gasses or liquids. Further, in the case when the electrodes 41, 42, 51, and 52 are not provided, the adsorption layer 81 can be provided on the flat surface without concavity and convexity. Accordingly, in the case of measuring a sample flowing through, for example, a micro channel, or the like, as well, a pressure loss in the channel hardly increases, and the high degree of freedom can be secured in designing the channel. Further, when the surface having the adsorption layer 81 provided thereon is flat, washing of the surface also becomes easy to be performed, and it is also suitable for repeated use of the microbalance 8. When, for example, a surface on a recessed portion 11 side of the microbalance 8 is constituted as a watertight seal structure that water or the like does not enter at this time, handling at the washing is further facilitated.

A constitution example of the microbalance 8 is explained by using FIG. 16 as above, but, for example, the adsorption layer 81 may be provided on a projecting portion side of the trapping energy mode portion 2, or a microbalance 8 constituted similarly to the elastic wave resonators 1a and 1b illustrated in FIG. 7, FIG. 8, and so on, may be used, or it is a matter of course that by constituting the elastic wave waveguide 100 in the piezoelectric body 10 and providing the electrodes 41, 42, 51, and 52, excitation may also be performed.

What is claimed is:

1. An elastic wave device comprising:
    a first propagation mode portion provided in an elastic wave waveguide made of an elastic body material;
    a trapping energy mode portion provided in the elastic wave waveguide and in which a second elastic wave being an elastic wave in an energy trapping mode is excited by a specific frequency component included in a first elastic wave being an elastic wave in a first or higher-order propagation mode propagated from the first propagation mode portion;
    a cutoff portion provided in a peripheral region of the trapping energy mode portion and having a cutoff frequency being a frequency higher than that of the second elastic wave; and
    a second propagation mode portion provided at a position adjacent to the trapping energy mode portion across the cutoff portion along a direction in which the first elastic wave propagates, and mode-converting the second elastic wave leaked through the cutoff portion to a third elastic wave being the elastic wave in the first or higher-order propagation mode to propagate the third elastic wave.

2. The elastic wave device according to claim 1, wherein the cutoff portion is formed to have a cutoff frequency being a frequency higher than that of the second elastic wave because a thickness of the elastic body material is thinner than that of the trapping energy mode portion.

3. The elastic wave device according to claim 1, wherein the elastic wave waveguide is formed in a manner that a thickness of the elastic body material in an outside region of the cutoff portion is thicker than that of the cutoff portion.

4. The elastic wave device according to claim 1, wherein the trapping energy mode portion is formed in a flat plate shape.

5. The elastic wave device according to claim 1, wherein the trapping energy mode portion is formed in a planoconvex lens shape.

6. The elastic wave device according to claim 1, wherein the trapping energy mode portion is formed in a manner that a planar shape thereof is a polygon with four or more angles, or a circle, or an ellipse.

7. The elastic wave device according to claim 1, further comprising:
    two or more trapping energy mode portions whose peripheries are each surrounded by the cutoff portion, and wherein
    the trapping energy mode portions are provided adjacently to each other or one another in a propagation direction of the elastic wave in the propagation mode to enable second elastic waves to be excited in the respective trapping energy mode portions to be coupled to each other or one another, and thereby a multi-mode coupled filter is constituted.

8. The elastic wave device according to claim 1, wherein the elastic body material is a piezoelectric body, and a first electrode to excite the first elastic wave is provided on the first propagation mode portion and a second electrode to take out the third elastic wave is provided on the second propagation mode portion.

9. The elastic wave device according to claim 1, wherein the first elastic wave is excited by irradiating the first propagation mode portion with a laser beam, and the third elastic wave is detected by a laser type vibration meter.

10. The elastic wave device according to claim 1, wherein the first propagation mode portion is used as the second propagation mode portion.

11. The elastic wave device according to claim 1, wherein the second elastic wave is an elastic wave in a high-order energy trapping mode.

12. The elastic wave device according to claim 1, wherein an adsorption layer to adsorb a substance to be sensed is formed on a front surface of the trapping energy mode portion.

13. An electronic component comprising:
    the elastic wave device according to claim 1.

* * * * *